US011069508B2

(12) United States Patent
Zeidler et al.

(10) Patent No.: US 11,069,508 B2
(45) Date of Patent: Jul. 20, 2021

(54) METHOD OF IMAGING A 3D SAMPLE WITH A MULTI-BEAM PARTICLE MICROSCOPE

(71) Applicant: Carl Zeiss MultiSEM GmbH, Oberkochen (DE)

(72) Inventors: Dirk Zeidler, Oberkochen (DE); Anna Lena Eberle, Essingen (DE)

(73) Assignee: Carl Zeiss MultiSEM GmbH, Oberkochen (DE)

( * ) Notice: Subject to any disclaimer, the term of this patent is extended or adjusted under 35 U.S.C. 154(b) by 0 days.

(21) Appl. No.: 16/734,741

(22) Filed: Jan. 6, 2020

(65) Prior Publication Data

US 2020/0243300 A1 Jul. 30, 2020

(30) Foreign Application Priority Data

Jan. 24, 2019 (DE) .......................... 102019000469.8

(51) Int. Cl.
*H01J 37/285* (2006.01)
*H01J 37/244* (2006.01)
*H01J 37/28* (2006.01)

(52) U.S. Cl.
CPC .......... *H01J 37/285* (2013.01); *H01J 37/244* (2013.01); *H01J 37/28* (2013.01); *H01J 2237/15* (2013.01); *H01J 2237/2857* (2013.01)

(58) Field of Classification Search
CPC .. H01J 37/00; H01J 37/02; H01J 37/22; H01J 37/222; H01J 37/26; H01J 37/261; H01J 37/28; H01J 37/285; H01J 37/244; H01J 37/263; H01J 37/265; H01J 2237/2857; H01J 2237/15; H01J 2237/2815; H01J 2237/2817

USPC .......................................... 250/306, 307, 311
See application file for complete search history.

(56) References Cited

U.S. PATENT DOCUMENTS

| 2015/0069235 | A1 | 3/2015 | Kemen et al. |
| 2015/0083911 | A1 | 3/2015 | Zeidler et al. |
| 2015/0357157 | A1* | 12/2015 | Mueller .................. H01J 37/28 250/396 R |
| 2015/0371816 | A1* | 12/2015 | Doi ........................ H01J 37/241 250/310 |

(Continued)

FOREIGN PATENT DOCUMENTS

| DE | 10 2013 014 976 | 3/2015 |
| DE | 10 2013 016 113 | 3/2015 |

(Continued)

OTHER PUBLICATIONS

Eberle et al., "Mission (im)possible—mapping the brain becomes a reality," *Microscopy*, 2015, vol. 64, No. 1, pp. 45-55.

*Primary Examiner* — Jason L McCormack
(74) *Attorney, Agent, or Firm* — Fish & Richardson P.C.

(57) ABSTRACT

A fast method of imaging a 3D sample with a multi-beam particle microscope includes the following steps: providing a layer of the 3D sample; determining a feature size of features included in the layer; determining a pixel size based on the determined feature size in the layer; determining a beam pitch size between individual beams in the layer based on the determined pixel size; and imaging the layer of the 3D sample with a setting of the multi-beam particle microscope based on the determined pixel size and based on the determined beam pitch size.

23 Claims, 7 Drawing Sheets

(56) References Cited

U.S. PATENT DOCUMENTS

2017/0315070 A1\* 11/2017 Kikuiri ................ H01J 37/244

FOREIGN PATENT DOCUMENTS

| WO | WO 2005/024881 A2 | 3/2005 |
| WO | WO 2007/028595 | 3/2007 |
| WO | WO 2007/028596 | 3/2007 |
| WO | WO 2007/060017 | 5/2007 |
| WO | WO 2016/124648 A1 | 8/2016 |

\* cited by examiner

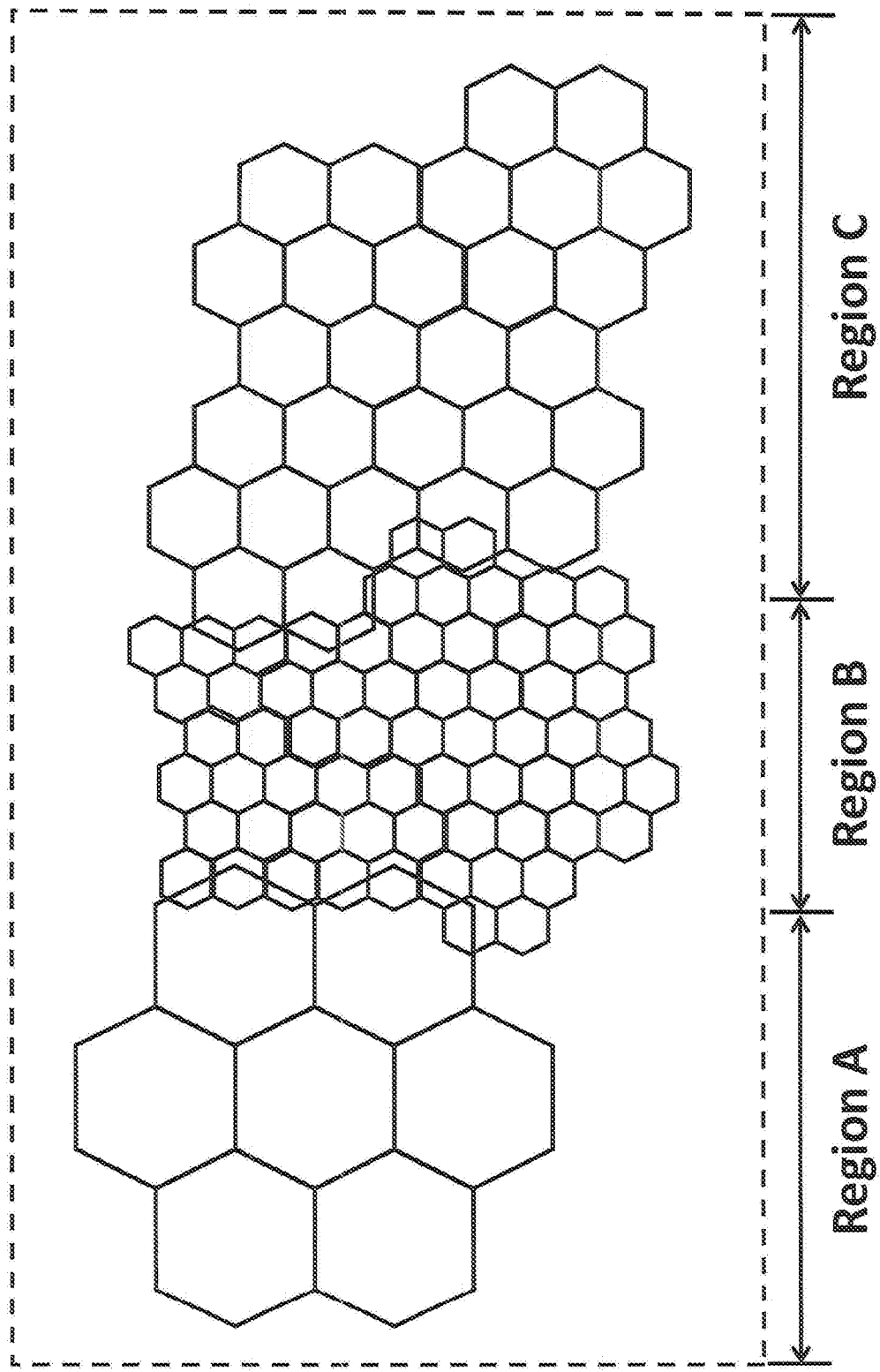

METHOD OF IMAGING A 3D SAMPLE WITH A MULTI-BEAM PARTICLE MICROSCOPE

FIELD

The present disclosure relates to charged particle beam systems and methods. More particularly, the present disclosure relates to a method of imaging a 3D sample with a multi-beam particle microscope, a corresponding system and a corresponding computer program product. The present disclosure is particularly suited for reverse engineering of integrated circuits.

BACKGROUND

Single-beam particle microscopes have been known for a long time. In these, a single beam is focused via particle optics onto an object to be examined and scanned over the latter. The particle beam can be an ion beam or an electron beam. Secondary particles, such as e.g. electrons, emitted from a location where the particle beam is incident, are detected and the detected particle intensity is assigned to the locations of the object on which the scanning particle beam is currently directed. Thus, it is possible to generate a particle-optical image of the object. Scanning of a field of view of a particle microscope with the particle beam involves time. The extent of the field of view is limited. If relatively large parts of the object are intended to be scanned, the object is desirably moved relative to the particle microscope to scan further fields of view. This in turn involves time. There is a desire for particle microscopes that can scan many objects and relatively large objects in a shorter time. It is conceivable to provide a larger number of single-beam particle microscopes, the microscopes operating in parallel to scan a plurality of objects simultaneously. However, this is a very expensive solution since a dedicated particle microscope with particle optics would be provided for each individual particle beam.

Here, multi-beam particle microscopes form a promising approach since a plurality of particle beams is guided jointly through a single particle optics arrangement in order to simultaneously scan the object to be examined with a bundle of particle beams. A multi-beam charged particle beam system is disclosed, for example, in WO 2005/024881 A2 and in WO 2016/124648 A1.

A possible application of single-beam particle microscopes as well as of multi-beam particle microscopes is the structure analysis of 3D samples, in particular reverse engineering. Reverse engineering, also called back engineering, is the process by which a man-made object is deconstructed to reveal its designs, architecture, or to extract knowledge from the object. For the structure analysis of 3D samples, an imaging process and a delayering process can be combined in a workflow. Imaging of the 3D sample is then done layer by layer. The data gained by imaging a complete stack of layers allows reconstructing a 3D data set of the 3D sample.

However, when high resolution is involved in imaging, to achieve for example a voxel size in the nanometer regime, huge amounts of data are usually collected. When a single-beam particle microscope is used for imaging, reverse engineering of an integrated circuit can take, for example, several months. Even with a multi-beam particle microscope, the time needed for reconstruction is still comparatively high and typically still can take several weeks. Therefore, a general challenge is to speed up imaging and therefore 3D sample reconstruction.

For integrated circuits, however, the feature size within the integrated circuits typically varies with the depth inside the 3D sample: the smallest features that involve highest resolution scanning are at the bottom layer of the chip, with the feature size in the layers above usually increasing gradually.

In this context, an approach to speed up the imaging process using a single-beam particle microscope can be adapting the scan pixel size to a value that is suitable for imaging the expected minimum feature size in the layer currently scanned. However, the overall speed for the 3D reconstruction of a 3D sample is still too low.

SUMMARY

The present disclosure seeks to provide a faster method for imaging a 3D sample with a multi-beam particle microscope. The method shall be particularly suited for reverse engineering of 3D samples and in particular for reverse engineering of integrated circuits.

According to a first aspect of the disclosure, the disclosure is directed to a method of imaging a 3D sample with a multi-beam particle microscope, the method including the following steps:
providing a layer of the 3D sample; determining a feature size of features included in the layer;
determining a pixel size based on the determined feature size in the layer; determining a beam pitch size between individual beams in the layer based on the determined pixel size; and imaging the layer of the 3D sample with a setting of the multi-beam particle microscope based on the determined pixel size and based on the determined beam pitch size.

Adjusting a pixel size for an imaging process using a single-beam particle microscope is a key feature for speeding up the imaging process. However, investigations of the inventors have shown that a simple transfer of that concept to a multi-beam particle microscope does not directly translate to the desired speed up. If the number of pixels per field of view becomes small, the image acquisition time for this respective field of view becomes small. However, the data acquisition time for an image containing multiple fields of view will then be dominated by overhead times for stage movements that are desired after every imaging of a field of view. Throughput calculations with calibrated speed data have shown that there are almost no speed gains by increasing the pixel size beyond a certain limit when using a low speed stage. A solution is to provide a faster stage, but this is very expensive. Therefore, the present disclosure provides a higher throughput even with a low speed stage but even more with a high speed stage:

According to the present disclosure, a beam pitch size between the individual beams of the multi-beam particle microscope in the plane of the layer to be imaged is determined based on the determined pixel size. Thereafter the beam pitch size between the individual beams of the multi-beam particle microscope in the plane of the layer to be imaged is adjusted to the determined beam pitch size and images of the layer are recorded with the multi-beam particle microscope with the adjusted beam pitch size between the individual beams. This has the effect that the speed up achieved by choosing an appropriate pixel size and more particularly in reducing the number of pixels to be acquired can be kept.

In the following, the disclosure will be described in more detail.

Preferably, imaging a 3D sample involves collecting a 3D data set of the sample. The dimensions of the sample itself can nevertheless be very small, for example in the micrometer regime. Preferably, the 3D sample can be sliced or divided into a plurality of layers. The 3D sample as such can be of any type. Examples are neurobiological samples or integrated circuits. In both examples, high resolution imaging is involved since the voxel size which is the size of the 3D data "point" is typically in the nanometer regime.

The charged particles with which a multi-beam particle microscope is operated can be for example electrons, positrons, muons, ions or other charged particles.

The method according to the present disclosure includes providing a layer of the 3D sample. This means that a layer of the 3D sample is provided in such a manner that its surface can be imaged using the multi-beam particle microscope. Two general approaches can be taken to provide the layer of the 3D sample: according to a first approach, the 3D sample is delayered in a non-destructive manner. Here, it is for example possible to cut or slice the 3D sample into a plurality of layers wherein each layer is put onto a substrate and can then be individually investigated with the multi-beam particle microscope. A second approach is destructive delayering of the 3D sample. According to this approach, the surface of the 3D sample is imaged first. Afterwards, this surface is removed, for example by ion beam milling, ion beam sputtering or charged particle beam induced gas etching, so that the new surface generated by delayering embodies the next layer that can be imaged. Technical examples for delayering of the 3D sample will be given below in this application.

According to the present disclosure, a feature size of features included in the layer to be imaged is determined. Determining a feature size can for example be realized by measuring a feature size of features included in the layer of interest. Alternatively, there already exists prior knowledge, e.g. design data or other information, about feature sizes of features included in the layer to be imaged. According to a preferred embodiment of the disclosure, the determined feature size is a minimum feature size in the layer to be imaged. The minimum feature size involves the highest resolution during imaging. The minimum feature size therefore limits the overall pixel size and therefore imaging speed for this layer of the 3D sample. Alternatively, the determined feature size can be an average feature size if highest resolution imaging is not needed. Imaging a 3D sample with a multi-beam particle microscope involves scanning with all beams in two different directions, in particular orthogonal directions. According to an embodiment, the feature size in the layer of interest is determined for each imaging direction separately. The pixel size needed to adequately scan the smallest features in each of the directions can vary in the two directions. Determining feature sizes in both directions in a separate manner therefore contributes to finding an optimum pixel size and therefore image acquisition speed. According to another embodiment, the minimum feature size is determined independent from imaging directions.

According to the present disclosure, a pixel size is determined based on the determined feature size in the layer to be imaged. The pixel size defines the resolution of imaging. The pixel size can vary in different imaging directions, but it is also possible that the pixel size is identical for both imaging directions. According to a preferred embodiment, the determined pixel size for imaging a respective layer is an optimum pixel size. This means that the pixel size is determined still small enough to cover the feature to be measured with a sufficient number of pixels, and it is at the same time big enough to allow for the maximum throughput. According to a preferred embodiment, a relation between the minimum feature size $fs_{min}$ and the optimum pixel size $ps_{opt}$ is $ps_{opt} \leq 0.5\ fs_{min}$. With a sufficiently small setting, the smallest features can be imaged faithfully. Preferably, the above relation holds for feature sizes and pixel sizes in all directions. Preferably, at least one of the following relations is fulfilled: $0.1\ fs_{min} \leq ps_{opt} \leq 0.5\ fs_{min}$, or $0.2\ fs_{min} \leq ps_{opt} \leq 0.5\ fs_{min}$, or $0.3\ fs_{min} \leq ps_{opt} \leq 0.5\ fs_{min}$, or $0.4\ fs_{min} \leq ps_{opt} \leq 0.5\ fs_{min}$.

According to a preferred embodiment the beam pitch size between the individual beams can be determined for each imaging direction separately. This means that the beam pitch size between individual beams in a first direction can differ from the beam pitch size between individual beams in a second direction. Of course, the beam pitch size between individual beams can be the same in both imaging directions.

According to a preferred embodiment, the determined beam pitch size for imaging a respective layer is an optimum beam pitch size. For this optimum beam pitch size, the overall time for imaging a layer of the 3D samples can be minimized. It is also possible that other imaging constraints are additionally taken into consideration and that under these constraints the beam pitch size is the optimum one.

According to the disclosure, the layer of the 3D sample is imaged with a setting of the multi-beam particle microscope based on the determined pixel size and based on the determined beam pitch size. According to a preferred embodiment, the setting of the multi-beam particle microscope is exactly the determined pixel size and exactly the determined pitch size. However, this is not necessarily the case. In any case, the determined pixel size and determined beam pitch size are initial values for calculating the setting of the multi-beam particle microscope. It is for example possible to take an even smaller pixel size for the setting, for example to be on the safe side to carry out imaging with the desired resolution or for other reasons. On the other hand, it is possible that using a larger pixel size than the determined pixel size might be advantageous, for example because just certain feature sizes are of interest in the data evaluation. Analogous considerations hold for the setting of the multi-beam particle microscope with respect to the beam pitch size.

According to a preferred embodiment of the present disclosure, the number of pixels in the single field of view is kept constant for imaging a plurality of layers. It has to be stressed that this also holds if the resolution for imaging a respective layer changes. In other words, the pixel size determined based on feature sizes in the respective layer can change, but the number of pixels in a single field of view scanned by an individual charged particle beam is nevertheless kept constant. According to a preferred embodiment, the number of pixels in a single field of view is kept constant for imaging all layers of the 3D sample. A typical number of pixels in the single field of view is 3.000×2000=6.000.000 pixels. Typical pixel sizes ps are in the following range: 0.5 nm to 20 nm. Then, assuming that in this example the number of pixels is kept at 3000×2000 pixels, the corresponding beam pitch sizes bps are in the following range: 0.5 μm to 60 μm. Preferably, small overlap regions between adjacent single fields of view are created which facilitates reconstruction of the entire image and in particular stitching. Advantageously, 5% to 10% of the size of the single field of view overlaps with a neighboring single field of view in each scanning dimension.

An optimum beam pitch size can be determined in dependence on the determined pixel size and the selected number of pixels per single field of view scanned by an individual charged particle beam so that adjacent single fields of views have the desired overlap, preferably in the range between 5% and 10% of the size of the single field of view in each scanning direction.

According to a preferred embodiment of the disclosure, the beam pitch values in the setting of the multi-beam particle microscope are chosen from a set of discrete values. This facilitates calibration of the multi-beam particle microscope. According to another preferred embodiment, the determined beam pitch size is then rounded down to the next discrete value for the beam pitch size.

According to a preferred embodiment of the disclosure, determining the feature size in a respective layer is based on a priori knowledge. It is, for example, possible that the structure of the 3D sample is already known from its design. This knowledge can be used to make an educated guess. It is also possible that a basically identical 3D sample of a batch of identical samples was measured before.

According to a preferred embodiment of the disclosure, determining the feature size in a predefined layer includes imaging of this layer with a light microscope. From a light microscopic overview image, structure sizes in this layer can be inferred. The resolution of a light microscope is lower than the resolution of a particle microscope, and normally the minimum structure sizes cannot be exactly determined in the image taken with a light microscope; however, an educated guess for minimum feature sizes can be made. It is possible that only certain areas of the layer to be scanned are imaged with the light microscope. It is also possible to take a complete image with the help of a light microscope, wherein the complete image can optionally be build up by a plurality of individual light microscopic images.

According to another preferred embodiment, determining the feature size in a respective layer includes taking one or more test images with the multi-beam particle microscope. It is possible to take test images with different pixel sizes and therefore varying resolution. It can then be determined whether the smallest feature sizes in the test region can be imaged with the desired accuracy/resolution. The test images can be taken for example in an area that is of specific interest. However, the amount of test images should be limited to an amount that does not slow down the overall process of imaging the 3D sample in its entirety to an unacceptable degree.

According to an alternative embodiment of the disclosure, determining the feature sizes in a respective layer includes carrying out an analysis of scattered light or scattered particles scattered at the surface of the 3D sample, respectively. The scattering characteristics of light or particles are related to the feature sizes of the features being the origin for scattering.

It is also possible to combine two or more of the above described methods for feature size analysis. The pre-requisite is that the feature size analysis can be carried out comparatively fast and in particular fast enough compared to the overall process of imaging a complete 3D sample with the multi-beam particle microscope. Preferably, the time for feature size determination is ≤10%, more preferably ≤1% of the time involved for imaging the 3D sample with the multi-beam particle microscope.

According to a preferred embodiment of the present disclosure, the method further includes the following step: Classifying a respective layer into a plurality of regions based on feature sizes in these regions. Such a classification makes particularly sense when the feature sizes show rather significant variations when comparing different regions of one layer. It is for example possible that a region in a layer exists that includes only features with large feature sizes, that another region exists where the feature sizes are of medium feature size, and that a third region exists wherein the feature sizes are significantly smaller than in the other regions. Therefore, the resolution that is involved to adequately scan the respective layer varies between regions in the respective layer. Preferably, classifying includes determining the feature sizes in a layer and dissecting the layer into regions with similar feature sizes. The feature size, preferably the minimum feature size, is determined for each region.

A single field of view (sFOV) is the area of a sample that is scanned (imaged) with an individual beam. A multiple field of view (mFOV) is the area that is imaged with a plurality of individual beams simultaneously and can include, for example, 20, 50, 100 or 61 or 91 sFOVs (according to the general formula $3n(n-1)+1$, wherein n is a natural number) or even more sFOVs. Preferably, a region is set up by a plurality of mFOVs, wherein the minimum feature size in each mFOV is similar, e.g. in a specified range. Preferably, the plurality of mFOVs forming the region is neighbored to one another so that the set-up region is mathematically connected. Depending on the minimum feature size in a region, imaging parameters are set for the respective region. Imaging parameters for differently classified regions normally vary from one another depending on the feature sizes assigned to the regions.

The number of regions into which a layer can be classified can vary. It is possible that 1, 2, 3, 4, 5, 10, 50 or 100 regions or even more regions can be identified in a layer to be scanned. It is also possible that a specific region in a respective layer is of no interest at all and that therefore this region will not be scanned at all. Furthermore, it is possible that a plurality of regions basically exhibits the same feature size, but that these regions are not connected to each other. It is also possible that the regions show a certain pattern with respect to feature sizes in the respective layer.

According to a preferred embodiment the method is characterized in that: determining a feature size of features included in a respective layer is carried out per region; determining a pixel size based on the determine feature size in the respective layer is carried out per region; determining a beam pitch size between individual beams in the respective layer based on the determined pixel size is carried out per region; and imaging a respective layer of the 3D sample is carried out with a setting of the multi-beam particle microscope per region based on the determine pixel size per region and based on the determined beam pitch size per region.

Here, the setting of the multi-beam particle microscope is not just set per layer, but it is set per region in the respective layer. Since the regions are classified based on feature sizes and the feature sizes influence desired resolution and therefore pixel size, the setting of the microscope per region within a respective layer allows for an even better speed up and optimization of the entire imaging process.

According to a preferred embodiment of the disclosure, the number of regions within a respective layer and/or the position of the regions within a respective layer vary from layer to layer for a plurality of layers. Alternatively, according to another preferred embodiment, the number of regions within a respective layer and/or the position or the regions within a respective layer is constant for a plurality of layers. When the number of regions and/or the position of the regions within a respective layer varies from layer to layer, the pixel size and beam pitch size can be adjusted in a very detailed way in each layer. However, this involves concrete knowledge about feature sizes in each region of each layer to be imaged with a high accuracy. Cases also exist wherein a priori knowledge yields that the number and position of the regions does not change between the layers, for example because the 3D sample has a very regular structure that is in principle known. Then, it is an option to define the regions once and to keep this definition for each layer within the entire imaging process of the 3D sample. Then, the number of regions and their position is the same in each layer.

According to another preferred embodiment of the disclosure, the method includes quasi non-destructive delayering of the 3D sample. Preferably, a series of ultrathin sections is generated with an ultramicrotome and placed on a solid substrate. The series of sections is subsequently imaged. In principle, other non-destructive delayering techniques are also possible. Non-destructive in this sense means that the sample is almost completely available physically after cutting, neglecting the small cutting losses.

According to another preferred embodiment of the disclosure, the method includes destructive delayering of the 3D sample. According to this embodiment, the surface of the 3D sample is imaged, and then typically a few nanometers of the surface are removed, with, for example, an ion beam, and then the freshly exposed surface provides the next layer and is imaged again with the multi-beam particle microscope. This destructive delayering procedure can be repeated many times until a complete 3D data set of the 3D sample has been acquired. According to a preferred embodiment, the delayering includes ion beam milling. This delayering method is particularly useful when the 3D sample is an integrated circuit.

According to a second aspect of the disclosure, the disclosure is directed to a method of imaging a 2D sample with a multi-beam particle microscope, the method including: providing a 2D sample; classifying the 2D sample into a plurality of regions based on feature sizes in these regions; determining a feature size, in particular a minimum feature size, per region; determining a pixel size based on the determined feature size per region; determining a beam pitch size between individual beams based on the determined pixel size per region; and imaging the 2D sample with a setting of the multi-beam particle microscope per region based on the determined pixel size per region and based on the determined beam pitch size per region.

A basic difference of the disclosure according to this second aspect compared to the first aspect of the disclosure is that the sample is a 2D sample and not a 3D sample. The 2D sample has just one layer and the surface of the 2D sample is imaged. Apart from this difference, the method steps according to this second aspect have already been described in connection with the first aspect of the disclosure. The definitions, examples and explanations given with respect to the first aspect of the disclosure also hold for the second aspect of the disclosure; preferred embodiments can also be transferred straight forward from the first aspect of the disclosure to the second aspect of the disclosure as long as it is no prerequisite that several layers of a sample are imaged.

According to a third aspect of the disclosure, the disclosure is directed to a computer program product with a program code for executing the method according to anyone of the embodiments described above. The code can be written in any possible programming language and can be executed on a control computer system. The control computer system as such can include one or more computers or processing systems.

According to a fourth aspect of the disclosure, the disclosure is directed to a system, including:

a multi-beam particle microscope, including: a charged particle source configured to generate a first charged particle beam; a multi beam generator configured to generate a plurality of charged particle beamlets from an incoming first charged particle beam, wherein each individual beamlet of the plurality of charged particle beamlets is spatially separated from other beamlets of the plurality of charged particle beamlets, an objective lens configured to focus incoming charged particle beamlets in a first plane in a manner that a first region in which a first individual beamlet of the plurality of charged particle beamlets impinges in the first plane is spatially separated from a second region in which a second individual beamlet of the plurality of charged particle beamlets impinges in the first plane; a projection system and a detector system including a plurality of individual detectors, wherein the projection system is configured to image interaction products leaving the first region within the first plane due to impinging charged particles onto a first one of the plurality of individual detectors and to image interaction products leaving the second region in the first plane due to impinging charged particles onto a second one of the plurality of individual detectors; and—a computer system for controlling the multi-beam particle microscope; wherein the system including the multi-beam particle microscope and the computer system is adapted to carry out the method according to any one of the embodiments described above.

The multi-beam particle microscope can be, for example, a scanning multi-beam electron microscope (mSEM).

It is possible to combine the described embodiments of the disclosure with one another as long as no technical contradictions occur.

BRIEF DESCRIPTION OF THE DRAWINGS

The disclosure will be more fully understood with reference to the attached drawings, in which:

FIG. 7 is a sketch illustrating regions in a layer classified according to different feature sizes.

DETAILED DESCRIPTION

Figure 1:
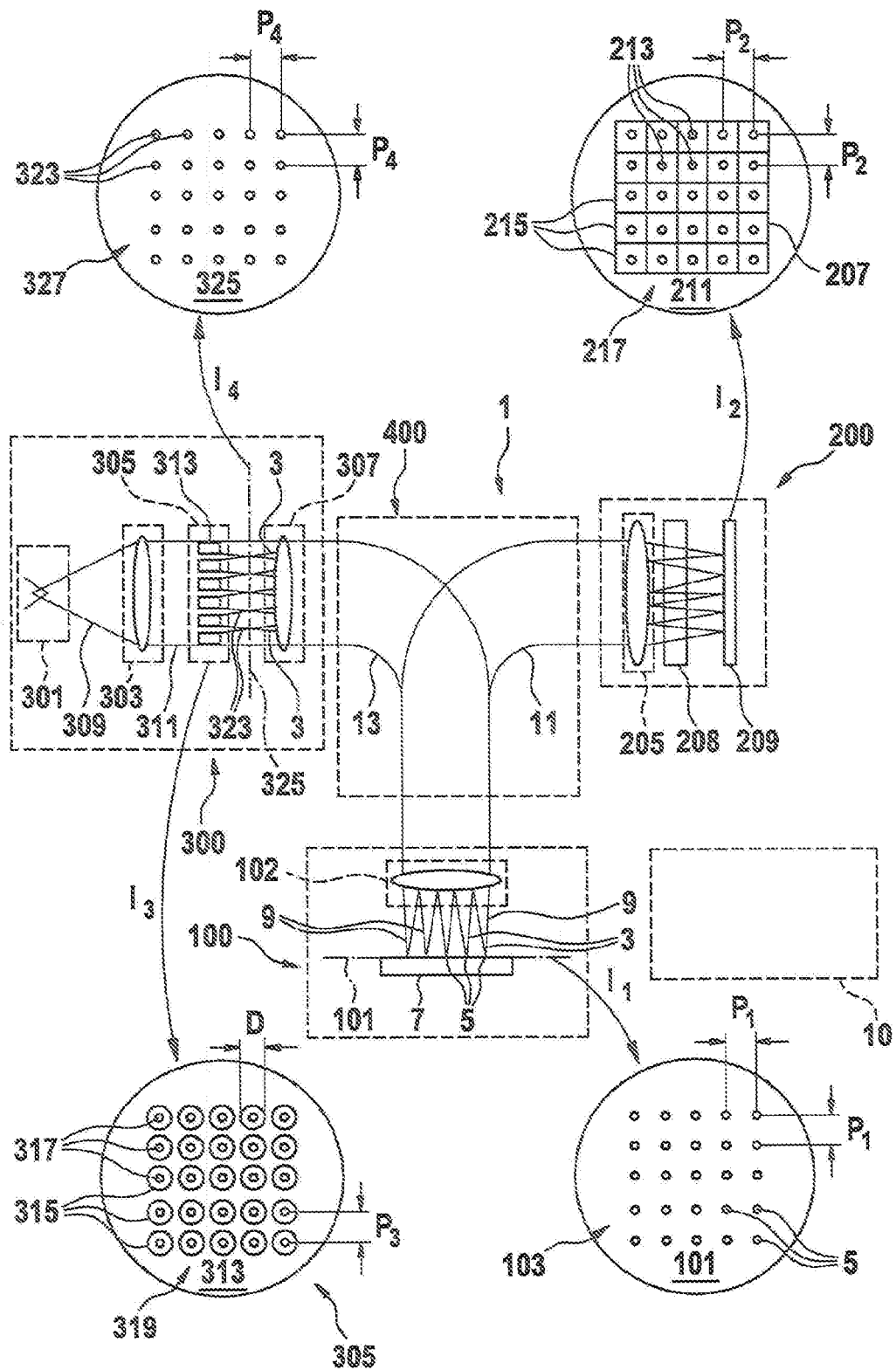
FIG. 1 is a sketch of an embodiment of a multi-beam charged particle system.

FIG. 1 is a sketch of a particle beam system 1 which employs multiple particle beams. The particle beam system 1 generates multiple particle beams which are incident onto an object to be inspected in order to make electrons emanate from the object and subsequently detect them. The particle beam system 1 is of the scanning electron microscope type (SEM) which employs a plurality of primary electron beams 3 which are incident at locations 5 on a surface of the object 7 where they generate a plurality of electron beam spots. The object 7 to be inspected can be of any desired sort and, for example, include a semiconductor wafer, a biological or materials sample and an arrangement of miniaturized elements or the like. The surface of the object 7 is arranged in an object plane 101 of an objective lens 102 of an objective lens system 100.

The enlarged section $I_1$ of FIG. 1 shows a top view of the object plane 101 with a regular rectangular array 103 of locations of incidence 5 which are formed in the plane 101. The number of the locations of incidence in FIG. 1 is 25, and they form a 5×5 array 103. The number 25 of locations of incidence is a small number selected for reasons of simplified representation. In practice, the number of beams and/or locations of incidence can be selected to be much larger—20×30, 100×100 and the like, by way of example.

In the embodiment represented, the array 103 of locations of incidence 5 is a substantially regular rectangular array with a constant distance $P_1$ between neighboring locations of incidence. This distance $P_1$ also illustrates the beam pitch size which will be described in more detail below. Exemplary values of the distance $P_1$ are 1 micrometer, 10 micrometers and 40 micrometers. However, it is also possible for the array 103 to have other symmetries such as, for example, a hexagonal symmetry.

A diameter of the beams spots formed in the object plane 101 can be small. Examples of values of the diameter are 1 nanometer, 5 nanometers, 100 nanometers and 200 nanometers. The focusing of the particle beams 3 for the formation of the beam spots is performed by the objective lens system 100.

The particles incident onto the object, generate electrons which emanate from the surface of the object 7. The electrons emanating from the surface of the object 7 are formed into electron beams 9 by the objective lens 102. The inspection system 1 provides an electron beam path 11 for feeding the multiplicity of electron beams 9 to a detection system 200. The detection system 200 includes electron optics with a projection lens 205 for directing the electron beams 9 onto an electron multi-detector 209.

Section $I_2$ in FIG. 1 shows a top view of a plane 211 in which individual detection regions are lying onto which the electron beams 9 are incident at certain locations 213. The locations of incidence 213 lie in an array 217 at a regular distance $P_2$ from one another. Exemplary values of the distance $P_2$ are 10 micrometers, 100 micrometers and 200 micrometers.

The primary electron beams 3 are generated in a beam generating device 300 which includes at least one electron source 301, at least one collimation lens 303, a multi-aperture arrangement 305 and a field lens 307. The electron source 301 generates a diverging electron beam 309 which is collimated by the collimation lens 303 in order to form a beam 311 which illuminates the multi-aperture arrangement 305.

The section $I_3$ in FIG. 1 shows a top view of the multi-aperture arrangement 305. The multi-aperture arrangement 305 includes a multi-aperture plate 313 which has a plurality of openings or apertures 315 formed therein. The centers 317 of the openings 315 are arranged in an array 319 which corresponds to the array 103 which is formed by the beam spots 5 in the object plane 101. A distance $P_3$ of the centers 317 of the apertures 315 from one another can have, for example, values of 5 micrometers, 100 micrometers and 200 micrometers. The diameters D of the apertures 315 are smaller than the distance $P_3$ of the centers of the apertures. Exemplary values of the diameters D are $0.2 \times P_3$, $0.4 \times P_3$ and $0.8 \times P_3$.

Electrons of the illuminating beam 311 penetrate the apertures 315 and form electron beams 3. Electrons of the illuminating beam 311, which are incident onto the plate 313, are captured by the latter, and do not contribute to formation of the electron beams 3.

Owing to an imposed electrostatic field, the multi-aperture arrangement 305 focuses the electron beams 3 in such a way that beam foci 323 are formed in a plane 325. A diameter of the foci 323 can be 10 nanometers, 100 nanometers and 1 micrometer, for example. The field lens 307 and the objective lens 102 provide a first imaging particle optics for the purpose of imaging the plane 325, in which the foci are formed, onto the object plane 101 so as to form the array 103 of locations of incidence 5 or beam spots on the surface of the object 7. The objective lens 102 and the projection lens 205 provide a second imaging particle optics for the purpose of imaging the object plane 101 onto the detection plane 211. The objective lens 102 is therefore a lens which is both part of the first and of the second particle optics, while the field lens 307 belongs only to the first particle optics, and the projection lens 205 belongs only to the second particle optics.

A beam switch 400 is arranged in the beam path of the first particle optics between the multi-aperture arrangement 305 and the objective lens system 100. The beam switch 400 is also part of the second particle optics in the beam path between the objective lens system 100 and the detection system 200.

Further information relating to such multi-beam inspection systems and components employed therein such as, for example, particle sources, multi-aperture plates and lenses, can be obtained from the International Patent Applications WO 2005/024881, WO 2007/028595, WO 2007/028596 and WO 2007/060017 and the German patent applications with the application numbers DE 10 2013 016 113.4 and DE 10 2013 014 976.2, the content of disclosure of which is incorporated in full in the present application by reference.

The depicted exemplary particle beam system 1 also includes a computer system 10. This computer system 10 can include several computers and/or sub computer systems. It can include for example a control computer system for controlling the particle beam system 1, one or more image acquisition systems and a user interface. Other configurations are also possible.

The computer system 10, or the components of the computer system 10 serving for assembling the detected data to an image, includes at least one frame grabber. This frame grabber also obtains information about how far the scanning deflection of the particle beams 3 incident on the object 7 has advanced. By way of example, this information can be fed to the frame grabber via a clock signal, which is output by the computer system 10 or a different clock generator and, for example, likewise serves for controlling the scanning deflection of the particle beams 3. The frame grabber then respectively generates image information by virtue of integrating particle intensities detected while scanning over a certain distance on the object, and converting them into greyscale values of an image and assigning these to a location in the image. The pixel size is then defined and adjusted as the distance on the object over which the particle intensities are integrated and assigned a single location (pixel) in the image.

Figure 2:
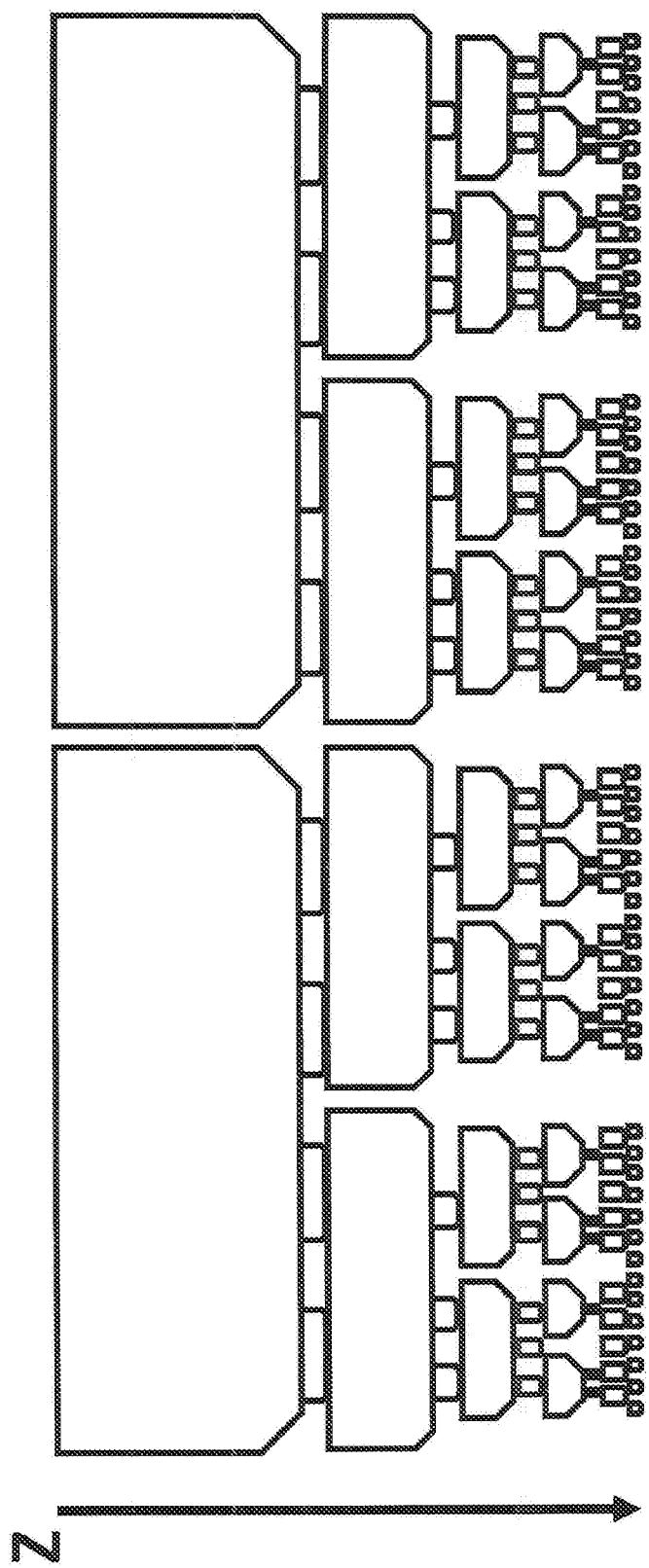
FIG. 2 is a sketch of a cross section of an integrated circuit.

FIG. 2 is a sketch of a cross-section of an integrated circuit. Today's integrated circuits can contain up to 15 or more layers with structures. The integrated circuit shown in FIG. 2 represents a schematic example of an integrated circuit in a very simplified way. The depicted integrated circuit includes five layers in z-direction. The first layer on top shows comparatively large features. The second layer as counted in z-direction includes smaller features when compared to the top layer. The third layer as counted from the top in z-direction includes features with a smaller feature size compared to the features included in the second layer etc. In general, the feature sizes gradually decrease from layer to layer in z-direction. The bottom layer of the integrated circuit includes the smallest features.

When imaging an integrated circuit with a plurality of layers, it is useful to also image intermediate layers to make sure that the information about the structure gained by the imaging is complete. For example, it might be advantageous to image 30 layers if the integrated circuit includes 15 structure layers. Of course, it is also possible to image even more layers/intermediate layers.

For imaging small features included in a layer, it is desirable to carry out imaging with a comparatively high resolution. Therefore, the pixel size has to be chosen comparatively small during scanning. Advantageously, an optimum pixel size can be chosen based on the minimum feature size present in the respective layer. Advantageously, the following relation holds between the minimum feature size $fs_{min}$ and the optimum pixel size $ps_{opt}$: $ps_{opt} \leq 0.5\ fs_{min}$. Preferably, at least one of the following relations is fulfilled: $0.1\ fs_{min} \leq ps_{opt} \leq 0.5\ fs_{min}$, or $0.2\ fs_{min} \leq ps_{opt} \leq 0.5\ fs_{min}$, or $0.3\ fs_{min} \leq ps_{opt} \leq 0.5\ fs_{min}$, or $0.4\ fs_{min} \leq ps_{opt} \leq 0.5\ fs_{min}$.

Figure 3:
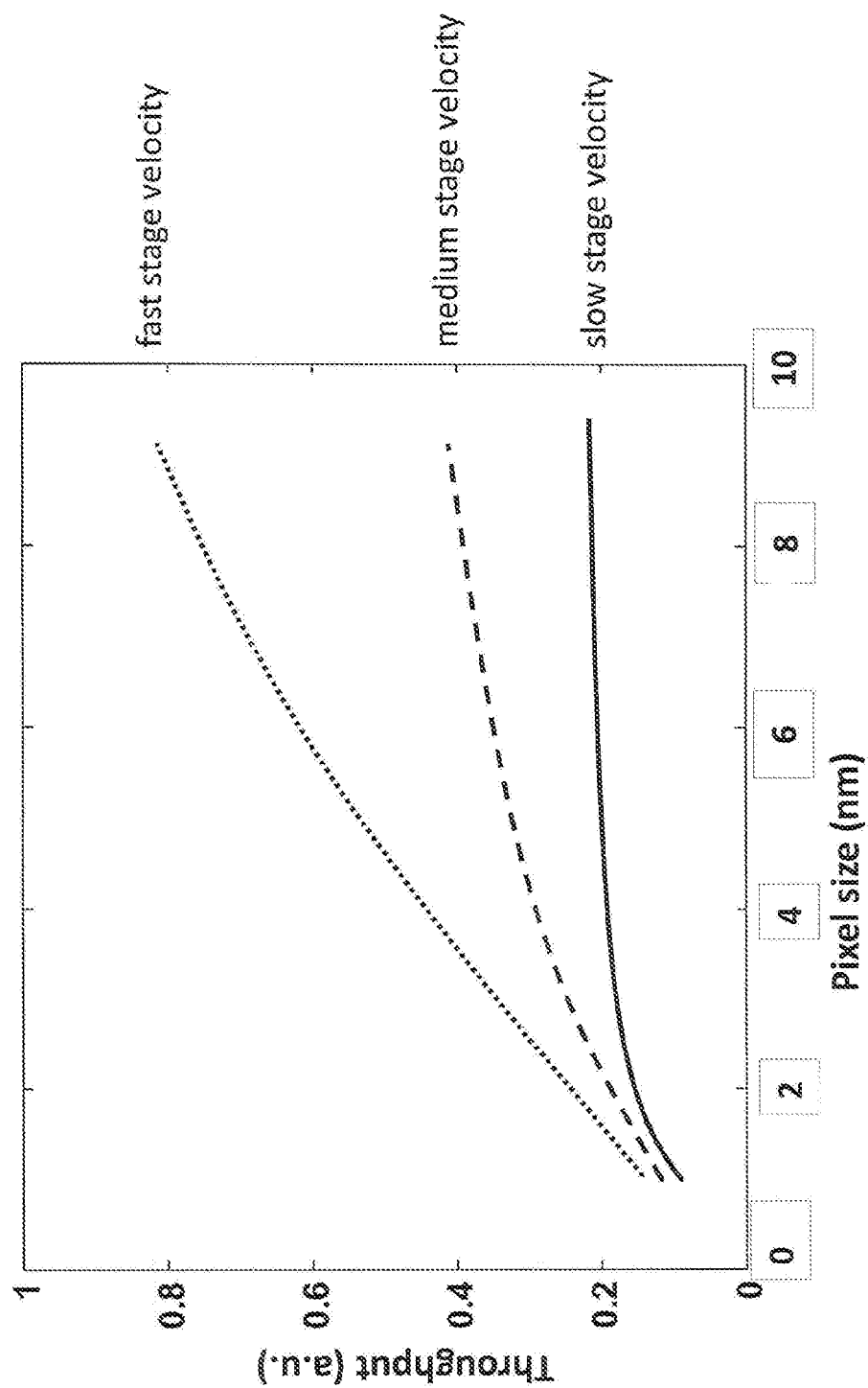
FIG. 3 is a diagram illustrating a relation between throughput and pixel size.

FIG. 3 is a diagram illustrating a relation between throughput and pixel size, but without adjustment of beam pitch size. The throughput is indicated in arbitrary units and the pixel size is provided in nanometers. The three graphs included in FIG. 3 show the relation between pixel size and throughput for a slow speed stage (straight line), for a medium speed stage (broken line) and for a fast speed stage (dotted line). If the pixel size is enlarged, the throughput generally increases. This effect is generally known from single beam particle microscopes. However, when a certain pixel size is reached (in the shown example this is already the case with pixel sizes of about 3 to 4 nanometers), the total data acquisition time starts to get dominated by overhead times, such as time for autofocusing/time for autostigmation and time for stage movements which do not scale with pixel size. The shown throughput calculation clearly shows that a high throughput is only achieved with a fast speed stage. The disclosure provides a solution to arrive at a high throughput also for a medium speed stage and even for a slow speed stage.

The key feature of this solution is to also adapt the beam pitch size between the individual beams in a respective layer that is imaged based on the determined pixel size. Preferably, the beam pitch size is optimized.

Figure 4:
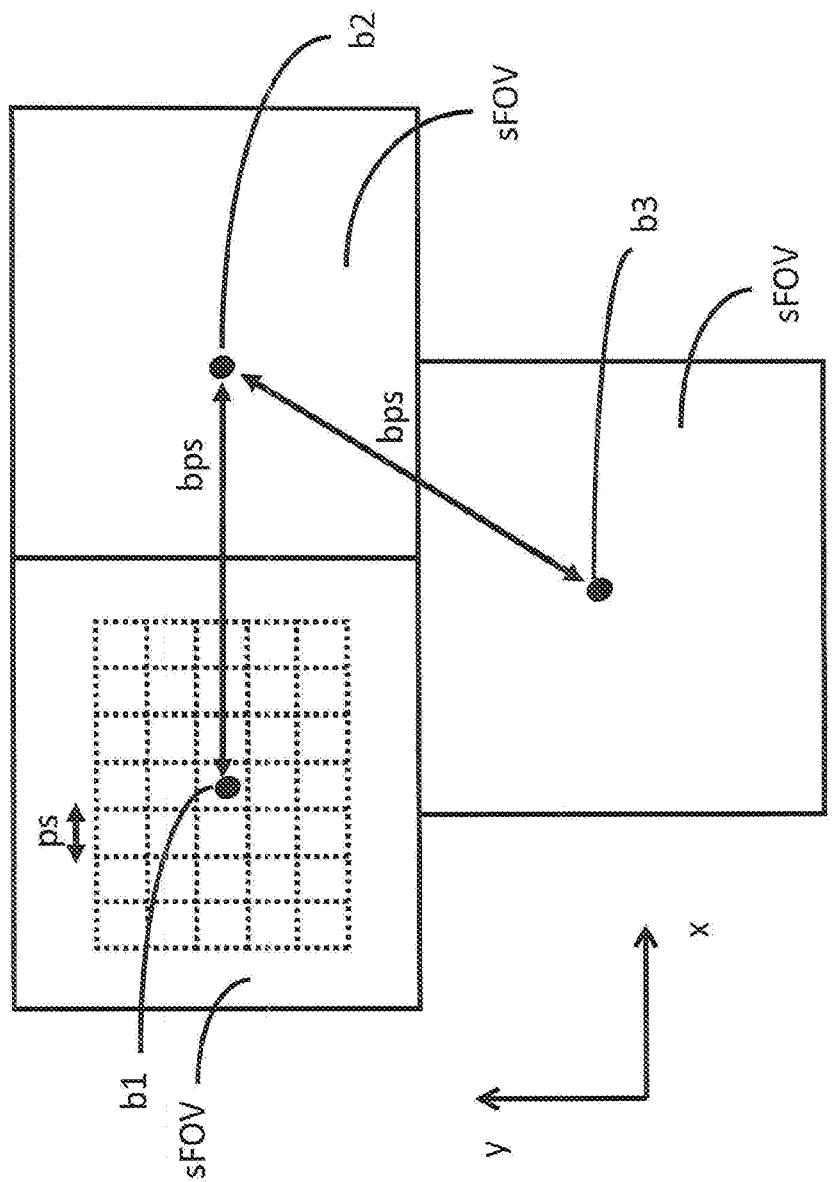
FIG. 4 is a sketch illustrating a definition of pixel size and beam pitch.

FIG. 4 is a sketch illustrating a definition of pixel size and beam pitch size according to the present disclosure. In FIG. 4, only three beams b1, b2 and b3 are shown for simplicity. Today's multi-beam charged particle microscopes normally include many more individual beams, for example more than 50, more than 80, or more than 100 beams. The beams as such can be arranged, for example, in a rectangular pattern. Other arrangements are also possible. Preferably, the individual beams are arranged according to a hexagonal structure, for example with 61 or 91 individual beams (according to the general formula 3n (n−1)+1, wherein n is a natural number).

In FIG. 4, each individual beam b1, b2 and b3 scans its particular single field of view (sFOV). This sFOV includes a certain number of pixels which are indicated for individual beam b1 with a rectangular pattern of dotted lines. It is noted that, in principle, the complete sFOV is scanned with the respective individual beam b1, b2 and b3, but FIG. 1 shows just an excerpt of all pixels for grounds of simplicity. The pixel size ps indicates the lateral increment of beam position during the imaging process between two neighbored pixels of the image, or with other words, the pixel size ps indicates the lateral increment of the beam positions during the scanning of the sample layer by the plurality of individual charged particle beams. In the depicted example, the pixel size ps is equal in directions x and y. However, it is also possible that the pixel size ps in x direction differs from the pixel size ps in y direction.

The beam pitch size bps indicates the distance between the individual beams during the scanning of the sample layer by the plurality of individual charged particle beams. In FIG. 4, the beam pitch size bps is illustrated as the distance between the centers of the sFOVs of beam b1 and beam b2. The beam pitch size bps in FIG. 4 is indicated for the x-direction. The beam pitch size bps can have the same value or a different value in y-direction. Preferably, the beam pitch size bps is the same for all neighbored pairs of individual beams which can e.g. be achieved with a hexagonal or quadratic arrangement of the individual beams. For other arrangements, e.g. a rectangular arrangement, the beam pitch size can be different in different directions. In general, different imaging directions can be orthogonal to each other, but this is not necessarily the case.

Figure 5:
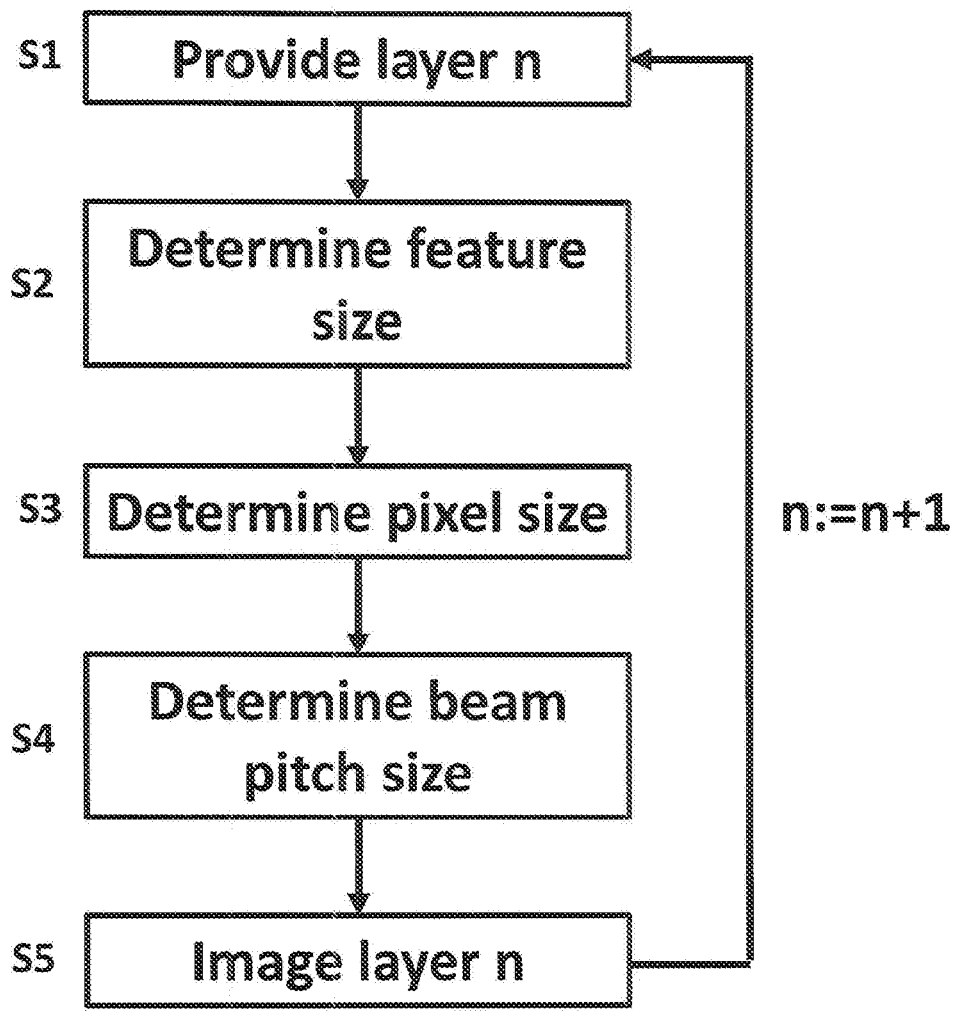
FIG. 5 is a flow chart of a method of imaging a 3D sample according to an embodiment of the disclosure.

FIG. 5 is a flow chart of a method of imaging a 3D sample according to an embodiment of the disclosure. According to method step S1, layer n of the 3D sample is provided. In principle, it is possible that the 3D sample is delayered in a destructive or in a non-destructive manner. If a non-destructive approach is used, the 3D sample can be cut or sliced into a plurality of layers, each layer is put onto a substrate and can then be individually investigated with the multi-beam particle microscope. If the destructive delayering approach is applied, the surface of the 3D sample is preferably imaged first and afterwards this surface is removed so that the new surface generated by delayering embodies the next layer that can be scanned. A possible technical realization is, for example, ion beam milling.

In step S2 a feature size of features included in layer n is determined. Preferably, a minimum feature size present in this layer n is determined. Advantageously, a fast method is applied for determining the feature size. Here, fast means comparatively fast if compared to the imaging time to image a complete layer of the 3D sample with the multi-beam particle microscope. Preferably, a fast method involves ≤10% and more preferably ≤1% of the time that is desired for imaging the sample with the multi-beam particle microscope. Alternatively, it is also possible to determine the minimum feature size in the respective layer n based on an educated guess, for example if the feature size is known by design. Fast methods for determining the feature size, in particular the minimum feature size, in a respective layer include, but are not limited to the following measurement methods: imaging layer n with a light microscope, taking one or more test images with the multi-beam particle microscope, and carrying out an analysis of scattered light or scattered particles. The determined feature size, in particular the minimum feature size, can be determined as an absolute value.

Then, in step S3, a pixel size is determined based on the determined feature size in layer n. Preferably, the determined pixel size is an optimum pixel size. Then, the chosen pixel size is still small enough to adequately image the smallest features included in the layer. Preferably, the optimum pixel size is equal to or smaller than half of the minimum feature size in the respective layer.

In step S4, a beam pitch size between the individual beams of the multi-beam charged particle microscope in layer n is determined based on the determined pixel size. Preferably, the beam pitch size is an optimum beam pitch size. The throughput achieved with the optimum pixel size and the optimum beam pitch size is preferably as high as possible for a given stage speed. Preferably, the number of pixels in the single fields of view is kept as large as possible which leads to a large mFOV as well. However, as the size of the mFOV increases, the aberrations of the electron-optical system in the particle-beam microscope will also increase and give rise to a larger size of the beam spots 5 on the sample. The beam spot size determines the resolution that can be obtained by the multi-beam particle microscope and should preferably be smaller than the pixel size. Therefore, the size of the mFOV cannot be chosen arbitrarily large and this also limits the number of pixels that can be adequately used. According to an alternative embodiment, the number of pixels acquired with an individual beam is kept constant. In terms of calibration, it is advantageous if the beam pitch size is chosen from a set of discrete values like for example 12 µm, 15 µm etc. Then, it is preferable that the determined beam pitch size is rounded down to the next discrete value in the set. Furthermore, it is preferable that the beam pitch size is chosen such that there exists a small overlap between neighbored sFOVs to ensure an adequate overall image reconstruction (stitching). In practice, 1% to 15% of the overall area of the sFOV overlap with neighbored sFOVs. Of course, other values for an overlap between sFOVs can be chosen.

In the next step S5, the charged particle optical components of the multi-beam charged particle microscope are adjusted to achieve the determined beam pitch size between the individual beams of the multi-beam charged particle microscope. This adjustment can be achieved by adjusting the combined excitations of the field lens 307 and the objective lens 102 in the embodiment shown in FIG. 1, i.e. by adjusting the magnification or imaging scale with which the plane 325 (in which the individual beamlets 323 are focused) is imaged into the plane 101. In addition the scanning ranges of the scanning deflectors (not shown in FIG. 1) are adjusted in a manner that each single field of view has the desired dimensions in both scanning directions.

As described above with reference to FIG. 1, the computer system 10, or the components of the computer system 10 serving for assembling the detected data to an image includes at least one frame grabber. The pixel size is defined and adjusted as the distance on the object over which the particle intensities are integrated and assigned a single location (pixel) in the image by the frame grabber.

Thereafter, layer n of the 3D sample is imaged with the setting of the multi-beam particle microscope based on the determined pixel size and based on the determined beam pitch size. Subsequently, the next layer n+1 is provided (either already prepared or by delayering the 3D sample in a destructive way). Then, method steps S2, S3, S4 and S5 are carried out again. The overall method can be carried out repeatedly until every layer of the 3D sample that is of interest is scanned.

Figure 6:
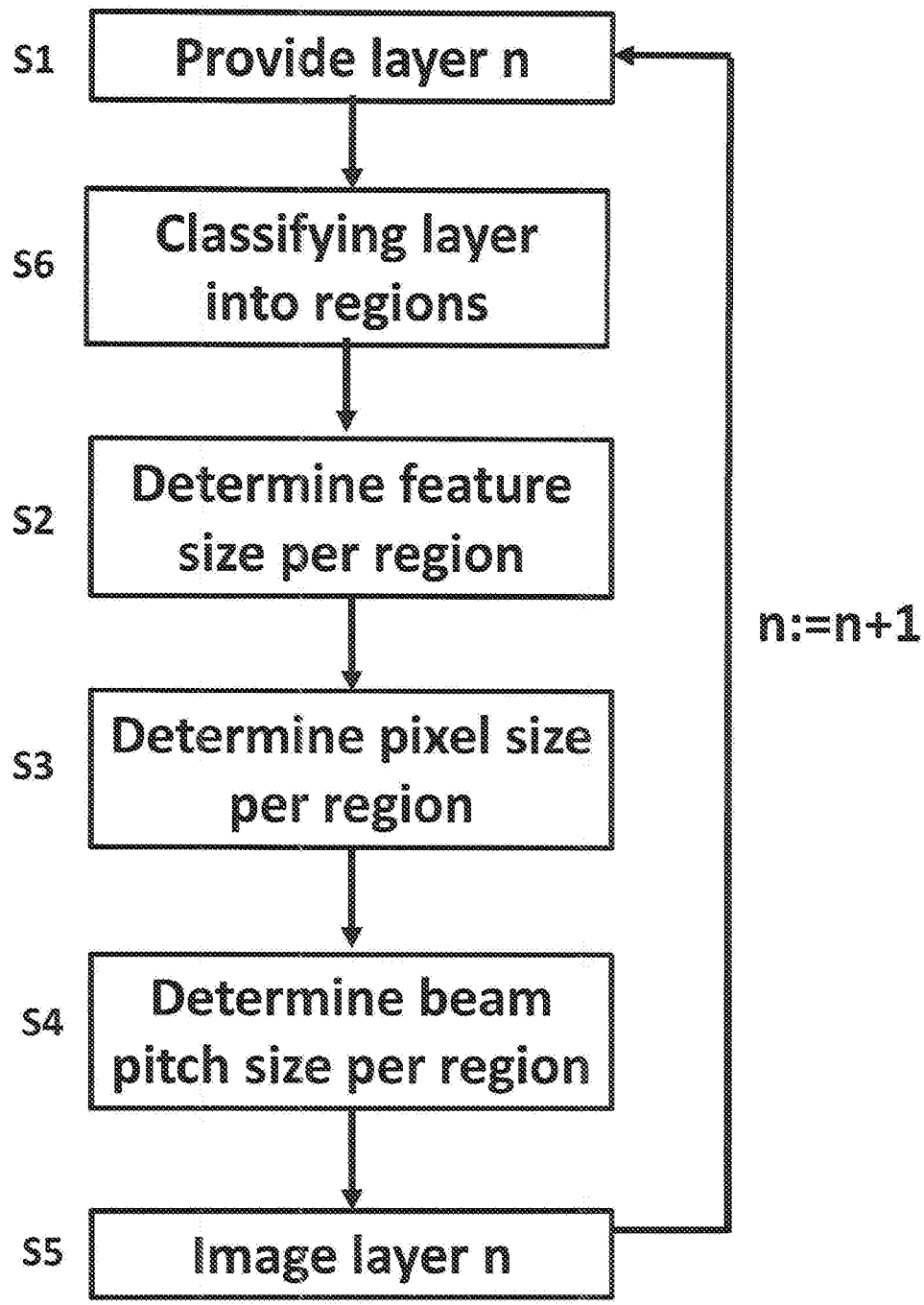
FIG. 6 is a flow chart of a method of imaging a 3D sample according to another embodiment of the disclosure.

FIG. 6 shows a flow chart of a method of imaging according to another embodiment of the disclosure. The difference between the embodiment depicted in FIG. 6 compared to the embodiment shown in FIG. 5 is that after the layer n is provided in step S1, layer n is classified into regions in step S6. This classification is carried out based on feature sizes in these regions. If the feature size significantly varies in a layer, a classification into regions makes sense to individually adapt the imaging parameters. This means for example, that the minimum feature size of a region is determined, that subsequently the optimum pixel size is determined based on the determined minimum feature size in this region, and that furthermore the beam pitch size is also determined per region. In this way, adjustment of setting parameters of the multi-beam particle microscope is carried out for every region or at least for every region that is of interest. If a region does not include features of interest, it is not necessary to set measurement parameters for this region or to even measure this region with the multi-beam particle microscope.

In general, a region with small feature sizes involves as a setting a comparatively small pixel size and also a comparatively small beam pitch size. A region with a medium feature size basically involves as a setting a medium pixel size and a medium beam pitch size. A region with large feature sizes basically involves a setting with a large pixel size and with a comparatively large beam pitch size. If a region does not include any relevant features, no imaging needs to be carried out.

After layer n is imaged (fully or just partly), the next layer n+1 is provided, either by non-destructive delayering or by destructive delayering of the 3D sample, for example by ion beam milling.

FIG. 7 is a sketch illustrating regions in a layer classified by different feature sizes. In the depicted example three different regions with different feature sizes (region A, region B and region C) are shown. When defining regions A, B and C, reference can be made to characteristic feature size ranges. It is possible to determine feature sizes in a layer with a fast method first and then to define the regions based on typical feature sizes, respectively. It is also possible to pre-define feature size ranges and then to assign the regions in a respective layer to this feature size range.

Region A includes comparatively large features and therefore this region can be imaged with a setting characterized by a comparatively large pixel size and as well by a comparatively large beam pitch size. In the depicted example, seven mFOVs indicated by the big hexagons are used. The hexagonal structure is the result of a hexagonal arrangement of the plurality of beams of the multi-beam particle microscope according to a preferred embodiment. However, other beam arrangements like for example a rectangular arrangement are also possible. Region B includes comparatively small features and here the resolution has been chosen comparatively high. In other words, the pixel size is comparatively small and so is the beam pitch size. This is illustrated by the small hexagons. Region C includes features in a medium feature size range. Here, the setting parameters for imaging include a medium pixel size and also a medium beam pitch size. In FIG. 7, this is indicated by the medium size hexagons.

Adjusting the setting of a multi-beam particle microscope for each layer and furthermore for specific regions in the respective layer allows for a very accurate and fast imaging process. In particular, it becomes possible to significantly lower the time needed to fully analyze a 3D sample.

What is claimed is:

1. A method, comprising:
    determining a pixel size based on a feature size in a layer of a 3D sample;
    determining a beam pitch size between individual beams of a multi-beam particle microscope based on the determined pixel size; and
    using the multi-beam particle microscope to image the layer of the 3D sample with a setting of the multi-beam particle microscope based on the determined pixel size and based on the determined beam pitch size.

2. The method of claim 1, further comprising repeatedly performing at least part of the method for a plurality of layers of the 3D sample.

3. The method of claim 2, wherein a number of pixels in a single field of view is kept constant for imaging the plurality of layers of the 3D sample.

4. The method of claim 1, wherein the feature size is a minimum feature size in the layer of the 3D sample.

5. The method of claim 1, wherein:
the pixel size is at most half of a minimum feature size; and
for a first single field of view, single fields of view adjacent to the first single field of view overlap with the first single field of view by between 5% and 10% in each scanning direction of the multi-beam particle microscope.

6. The method of claim 1, wherein the pixel size is at most half of a minimum feature size.

7. The method of claim 1, further comprising selecting the beam pitch size from a set of discrete values of the multi-beam particle microscope.

8. The method of claim 7, further comprising rounding down the determined beam pitch size to the next discrete value for the beam pitch size.

9. The method of claim 1, further comprising using a priori knowledge to determine the feature size in the layer of the 3D sample.

10. The method of claim 1, further comprising using a light microscope to image the layer of the 3D sample to determine the feature size of the layer of the 3D sample.

11. The method of claim 1, further comprising using the multi-beam particle microscope to take at least one test image to determine the feature size in the layer of the 3D sample.

12. The method of claim 1, further comprising analyzing scattered light or scattered particles to determine the feature size in the layer of the 3D sample.

13. The method of claim 1, further comprising classifying the layer of the 3D sample into a plurality of regions based on feature sizes in the regions.

14. The method of claim 13, further comprising:
determining, per region, a feature size of features in the layer of the 3D sample;
determining, per region, a pixel size based on the determined feature size in the region;
determining, per region, a beam pitch size between individual beams of the multi-beam particle microscope; and
imaging, per region, the layer of the 3D sample with a setting of the multi-beam particle microscope based on the determined pixel size in the region and based on the determined beam pitch size for the region.

15. The method of claim 14, further comprising repeatedly performing at least part of the method for a plurality of layers of the 3D sample,
wherein a number of regions within a respective layer of the 3D sample and/or a position of the regions within a respective layer of the 3D sample: a) varies from layer to layer for a plurality of layers; or b) is constant for a plurality of layers.

16. The method of claim 1, further comprising non-destructive delayering of the 3D sample.

17. The method of claim 1, further comprising destructive delayering of the 3D sample.

18. The method of claim 17, wherein delayering comprises at least one member selected from the group consisting of ion beam milling, ion beam sputtering, and charged particle beam induced gas etching.

19. The method of claim 1, wherein the 3D sample comprises an integrated circuit.

20. One or more machine-readable hardware storage devices comprising instructions that are executable by one or more processing devices to perform operations comprising the method of claim 1.

21. A system comprising:
one or more processing devices; and
one or more machine-readable hardware storage devices comprising instructions that are executable by the one or more processing devices to perform operations comprising the method of claim 1.

22. The system of claim 21, further comprising a multi-beam particle microscope.

23. The method of claim 1, wherein, for a first single field of view, single fields adjacent to the first single field of view overlap with the first single field of view by between 5% and 10% in each scanning direction of the multi-beam particle microscope.

* * * * *

UNITED STATES PATENT AND TRADEMARK OFFICE
CERTIFICATE OF CORRECTION

PATENT NO. : 11,069,508 B2
APPLICATION NO. : 16/734741
DATED : July 20, 2021
INVENTOR(S) : Dirk Zeidler and Anna Lena Eberle It is certified that error appears in the above-identified patent and that said Letters Patent is hereby corrected as shown below:

In the Claims

Column 16, Line 16, Claim 15, delete "orb)" and insert -- or b) --.

Signed and Sealed this
Twenty-eighth Day of June, 2022

*Katherine Kelly Vidal*

Katherine Kelly Vidal
*Director of the United States Patent and Trademark Office*